United States Patent [19]
Miura et al.

[11] Patent Number: 4,612,268
[45] Date of Patent: Sep. 16, 1986

[54] METHOD OF FORMING PHOSPHOR PATTERN ON FLUORESCENT SCREEN FOR COLOR PICTURE TUBES WITH POLYMER COAGULENT

[75] Inventors: Kiyoshi Miura; Hiroshi Yokomizo; Osamu Sasaya, all of Mobara; Hajime Morishita, Ota; Yoshifumi Tomita, Mobara, all of Japan

[73] Assignee: Hitachi, Ltd., Tokyo, Japan

[21] Appl. No.: 753,793

[22] Filed: Jul. 8, 1985

Related U.S. Application Data

[63] Continuation of Ser. No. 193,399, Oct. 2, 1980, abandoned.

[30] Foreign Application Priority Data

Sep. 28, 1979 [JP] Japan .................. 54-123790

[51] Int. Cl.$^4$ .................................. G03C 5/00
[52] U.S. Cl. .......................... 430/28; 430/23; 430/29; 430/144
[58] Field of Search .......... 430/28, 29, 144, 23, 430/24, 25, 26, 27

[56] References Cited

U.S. PATENT DOCUMENTS

| | | | |
|---|---|---|---|
| 3,269,838 | 8/1966 | Saulnier | 430/28 |
| 3,484,240 | 12/1969 | Jonkers | 430/26 |
| 3,515,553 | 6/1970 | Tiley | 430/26 |
| 3,981,729 | 9/1976 | Saulnier | 430/28 |
| 4,273,842 | 6/1981 | Nonogaki et al. | 430/26 |
| 4,293,586 | 10/1981 | Unnai et al. | |
| 4,324,850 | 4/1982 | Tomita | |
| 4,339,475 | 7/1982 | Hinosugi et al. | |

FOREIGN PATENT DOCUMENTS

| | | | |
|---|---|---|---|
| 55-02201 | 1/1980 | Japan | 430/144 |
| 7803907 | 10/1978 | Netherlands | 430/144 |

OTHER PUBLICATIONS

Levy, S. et al., "The Preparation of Phosphor Screens for Color-Television Tubes", *Sylvania Tech.*, 7/1953, pp. 60–63.

*Primary Examiner*—Charles L. Bowers, Jr.
*Attorney, Agent, or Firm*—Charles E. Pfund; Dike, Bronstein, Roberts, Cushman & Pfund

[57] ABSTRACT

A method of forming a color picture tube fluorescent screen by so-called dry process. After a photosticky substance mainly containing a diazonium compound is coated on a panel inner face, phosphor is adhered to portions of the compound which have been exposed to light through a color selection electrode and rendered sticky, and surplus phosphor applied on unexposed portions of the compound is removed, the above steps being consecutively repeated for phosphors of three colors to form picture elements of triads of three color phosphors on the panel inner face. The panel inner face is then treated with an aqueous solution containing at least polymer coagulant.

20 Claims, No Drawings

METHOD OF FORMING PHOSPHOR PATTERN ON FLUORESCENT SCREEN FOR COLOR PICTURE TUBES WITH POLYMER COAGULENT

This is a continuation of co-pending application Ser. No. 193,399 filed on Oct. 2, 1980, abandoned.

BACKGROUND OF THE INVENTION

This invention relates to a method of forming a fluorescent screen for color picture tubes.

The fluorescent screen for a color picture tube comprising picture elements of triads of green, blue and red phosphors arranged in a regular pattern is generally manufactured by utilizing photo-chemical reactions as well known in the art.

One of such methods is a so-called dry process in which a film of a photosticky substance which becomes sticky when exposed to light is issued and phosphors are adhered to this film. This invention relates, more particularly, to the improvement of such a dry process.

The aforementioned dry process will now be described specifically below.

A substance which becomes sticky when exposed to light is coated on a panel inner face of a bulb. Used as such a substance is a composition mainly containing diazonium compound, i.e. complex salt of a diazonium compound with halogenized metal salt (zinc chloride, cadmium chloride, stannous chloride) or with nonmetal fluoride salt fluoroboric acid etc.) including polymer compounds, and surfactants as additives. Such substances are thought to become sticky because diazonium compound frees deliquescent substances when it is decomposed by exposure to light.

Next, a color selection electrode such as a shadow mask is mounted on the panel through which portions, where the phosphor emitting the first color, for instance, green, are to be applied, are exposed to light. The portion which has been exposed to the light which passes through apertures in the shadow mask exhibits sticky properties. Then, the powder of phosphor of the first color is applied on the inner face of the panel to be sufficiently adhered to the portion which has become sticky. Surplus powder on unexposed portions is then removed by development such as air blowing. Now the panel inner face has been provided with picture elements of the first color phosphor. The aforementioned steps following the exposure step will be repeated consecutively for other two colors to complete picture elements of phosphors of three colors, i.e. green, blue and red.

In the prior art process described above, following the formation of phosphor picture elements of three colors, in advance of subsequent filming or aluminizing, it is required to wash the panel inner face with water or the like to sufficiently remove the residue of diazonium compound. This is necessary because the brightness of the fluorescent screen is reduced by the residue of diazonium compound if remained thereon. With the conventional process, however, it is difficult to obtain a fluorescent screen of high quality during washing since the adhesiveness thereof is weak.

SUMMARY OF THE INVENTION

This invention aims to eliminate problems in the prior art method and has for its object to provide a method of forming, in dry process, a color picture tube fluorescent screen which can prevent phosphors from peeling off.

Another object of this invention is to provide a method of forming a fluorescent screen of color picture tube which can assure higher brightness as compared with the conventional screen.

This invention features in that the inner face of the panel is treated and washed by a solution of polymer coagulant or an aqueous solution containing a polymer coagulant and a surfactant after the formation of phosphor elements has been completed.

This treatment prevents the phosphor from peeling off because the polymer coagulant becomes entangled with phosphor particles to strengthen the adhesion among phosphors or between a phosphor and the panel inner face. Since the surfactant reduces surface tension, when added, it improves penetration of the treatment solution into the fluorescent screen, preventing local unevenness of the fluorescent screen or peeling-off of the phosphor. The washing is conducted with water, with the treatment solution per se or with a low concentration treatment solution. Washing with the treatment solution per se is effective to promote the brightness by eliminating the residue of decomposed constituents of the photo-sensitive composition and constituents thereof which have not been decomposed. In washing with water, although the elimination effect as above is reduced, the residue of the treatment solution can be removed. In the washing step using the low concentration treatment solution and especially when the concentration is extremely low or close to water, the effect to remove the substance which is still not decomposed and the residue of decomposed substance is reduced, but the amount of the low concentration treatment solution which remains on the screen is remarkably small. In washing with a treatment solution of a concentration higher than the treatment solution per se, the amount of residue is increased, raising detrimental problems. Although the washing step is effective to assure excellent filming in the subsequent step, it may be omitted as desired.

In short, the essentiality of this invention resides in that the fluorescent screen is treated with the polymer coagulant after the completion of phosphor picture elements. Secondary effect is gained by adding surfactant to the treatment solution of polymer coagulant. Further, by adding a washing step to the treatment step, preliminary treatment for excellent filming can be achieved.

DESCRIPTION OF PREFERRED EMBODIMENTS

This invention will now be described in detail hereinafter. Phosphor stripes or dots of three colors are first formed on the inner face of the panel of color picture tube using the photosticky substance mainly containing diazonium compound. The diazonium compound is typically exemplified as chloro-p-diazodimethylaniline zinc chloride, but other varieties of diazonium compounds may also be used. As the additive agent to improve applicability or to prevent fog, polymer such as alginic acid propylene glycol ester or polyvinyl alcohol, surfactant or ethylene glycol is added. In order to increase adhesiveness onto the panel face, a photocrosslinking agent such as bichromate salts, chrome alum or iron alum may be added.

In the case where a color picture tube of black matrix type is manufactured, it is advisable to form a black matrix film on the inner face of the panel before a photosticky substannce is coated thereon. As the phosphor to be applied thereon, the phosphor with pigment, which has been popularly used recently, may be utilized.

Then, the panel inner face on which the phosphor has been applied is treated with either a solution of polymer coagulant or an aqueous solution containing a polymer coagulant and a surfactant. The temperature for such a treatment may be the room temperature. The above treatment dramatically strengthens the adhesion of the phosphor, and thus prevents the same from peeling off and simultaneously washes the fluorescent screen, and dissolves the diazonium compound residue.

As the polymer coagulant, various types may be used, of which the most effective one for the purpose of the present invention has a greater coagulating property for phosphor and is exemplified as polyacrylamide, partially hydrolized salt of polyacrylamide, sodium salt of polyacrylic acid, gelatin, polyalginic acid soda or carboxymethylcellulose, or a mixture of some of these substances.

As the surfactant, various types may be used; it is desirable to use a surfactant which can remarkably reduce the surface tension of the treatment solution, and greatly enhance the penetration and the wetting thereof into the fluorescent screen.

As a specific example, used is polyoxyethylenealkyl ether or polyoxyethylenealkylphenol ether which is a non-ionic surfactant, alkylbetaine which is an ampholytic surfactant, polyoxyethylene sulfate salt which is an anionic surfactant, or a mixture of some of these substances.

The higher the concentration of the treatment solution is, the more effective it is; however, considering economic factors and handlability, it should remain within a certain limit.

The concentration of the polymer coagulant, therefore, may be about 0.01 to 1 weight %, and preferably 0.02 to 0.5 weight % while the concentration of the surfactant may be 0.05 to 10 weight % and preferably 0.2 to 5 weight %. As to the relation between the above two, it is desirable to make the concentration of the surfactant relatively high when the concentration of polymer coagulant is low (viscosity thereof is also low). Conversely, it is desirable to make the concentration of the polymer coagulant relatively high when the concentration of the surfactant is low. In short, the concentrations of the above two are in a complementary relation. Also, by adding colloidal silica by 0.01 to 0.5 weight %, preferably 0.1 weight %, the brightness of the fluorescent screen can further be improved.

The pH of the treatment solution is 4.5 to 9 and preferably 5.5 to 8. When the pH is excessively low, or excessively high, it tends to cause peeling-off of the phosphor and, therefore, is not suitable for the purposes of the present invention. In performing the treatment according to the invention, the inner face of the panel may be wetted with the solution which is poured thereon while the panel is rotated with the inner face thereof faced upward, it may be wetted by the solution which is poured from a rod nozzle while the panel is rotated with the inner face thereof faced either horizontally or downwardly, or it may be wetted by dipping the panel into the solution. Considering mass production, it is preferable to adopt the former two methods.

The speed of the rotation is desirably adjusted so as to wet the whole area of the fluorescent screen with the solution as fast as possible and usually set at 15 to 180 rpm. This is because if the wetting takes too much time to wet the whole area, it tends to cause undesirable irregularities depending on locations. As to the time for the treatment, the longer is the treatment time, the more effective are the cleansing and the improvement of the adhesion, but the treatment for 1 second to 3 minutes will suffice. After the treatment, the solution will be eliminated by tilting the panel or by spinning it out at a high speed.

The inner face of the panel is then sufficiently cleaned by, for instance, washing with water. Since in this phase, the adhesiveness of the phosphor has been increased by the treatment, the phosphor will not be peeled off even if the panel is washed relatively strongly. When the panel has been treated with a large amount of treatment solution, the washing with water may be omitted. The fluorescent soreen thus completed is sent via drying step or directly to the filming process for completion of a picture color tube.

EXAMPLE 1

A photosticky substance of the composition shown below was coated on an inner face of a panel of a 14-inch color picture tube and dried to form a film.

| chloro-p-diazodimethyl aniline zinc chloride | 3 weight % |
| --- | --- |
| alginic acid propyleneglycol ester | 0.6 |
| polyvinylalcohol | 0.07 |
| ethylene glycol | 0.02 |
| pluronic L-92 (surfactant) | 0.005 |
| ammonium bichromate | 0.007 |
| water | remainder |

After the shadow mask was mounted on the panel, luminescent portions were exposed to light under the condition that the illumination is 18W/m2 and exposure time is 200 seconds. After the exposure, phosphor powder for green color was applied on the inner face of the panel and adhered to the exposed portions. Surplus phosphors appplied on unexposed portions were elimiated by an air-spray development. The steps following the exposure were repeated for phosphor powders for blue and red colors consecutively to complete the stripes of triads of phosphor on the inner face of the panel.

Then, the panel inner face with the phosphors adhered thereto was dipped for 30 seconds in 0.01 weight % of an aqueous solution of polyacrylamide which is a polymer coagulant available from Sumitomo Chemical Co., Ltd. under the brand name of Sumifloc. When the produced fluorescent screen was inspected, it was judged to be an excellent fluorescent screen freed from peeling-off of the phosphors and unevenness. Alternatively, the panel inner face was dipped and moved in the solution to obtain a more excellent fluorescent screen.

EXAMPLE 2

Using a photosticky substance of the type similar to Example 1 and the exposure through a shadow mask, fluorescent stripes of three colors were formed on an inner face of the panel.

The inner face of the panel with phosphors adhered thereto, while being rotated at 20 rpm, was treated with about 100 ml. of aqueous solution (viscosity: about 150CP) containing 0.1 weight % of polyacrylamide and 0.5 weight % of polyoxyethylenealkylphenol ether (available from Kao-Atlas Co., Ltd. the brand name of Emulgen 810) which is a nonionic surfactant. The time for treatment was 1 minute.

After the treatment, the fluorescent screen was inspected and was judged to be an excellent screen freed from peeling off of the phosphor and irregularities.

EXAMPLE 3

Using a photosticky substance of the type similar to Example 1 and exposure through a shadow mask, phosphor stripes of three colors were formed on an inner face of the panel.

The inner face of the panel with the phosphors adhered thereto, while being rotated at a speed of 20 rpm., was treated with about 100 ml. of aqueous solution (viscosity: about 150CP) containing 0.1 weight % of polyacrylamide and 5 weight % of polyoxyethylenealkylphenol ester. The time for the treatment was 1 minute.

The fluorescent screen was inspected after the treatment and was judged to be excellent, freed from the peeling-off of the phosphor and irregularities.

EXAMPLE 4

The fluorescent screens thus obtained by Examples 1, 2 and 3 were further washed with pure water which was supplied via a rod nozzle and under the pressure of about 1 kg/cm2. This treatment facilitated the following filming process.

EXAMPLE 5

The fluorescent screens obtained from Example 1, 2 and 3 were further washed with the treatment solution per se to prepare for better filming process.

EXAMPLE 6

The fluorescent screens obtained from Examples 1, 2 and 3 were washed with a low concentration treatment solution to prepare better filming process.

EXAMPLE 7

The treatment solution for Example 2 was added with 0.1 weight % colloidal silica and by using the resulting solution, a fluorescent screen drastically improved in brightness was obtained through a similar treatment to Example 2.

When the fluorescent screens obtained by these Examples of the present invention were compared with those obtained by the prior art method where the panel inner face is washed with pure water immediately without being treated by the processes of this invention, the prior art fluorescent screens were proven to be unsatisfactory, suffering from peeling-off of the phosphors.

The brightness of the color picture tubes manufactured by the method according to the present invention is impoved by about 10% compared with that of the prior-art method.

As will be seen from the foregoing description, the adhesiveness of the phosphor is improved by treating the phosphor film, formed by utilizing diazonium compound, with the aqueous solution containing the polymer coagulant and surfactant according to the present invention, thereby eliminating problems such as peeling-off of the phosphors. The present invention further enhances the effect of the first washing and enables the sufficient washing after the treatment, thereby ensuring the formation of the fluorescent screen of color picture tube with better quality and improved brightness.

What is claimed is:

1. In a method of forming a fluorescent screen for a color picture tube comprising:
    a first step of coating an inner panel face of a bulb of the color picture tube with a photosticky substance mainly containing a diazonium compound to form a layer of the compound:
    a second step of exposing to light through a color selection electrode portions of said compound layer where a first color phosphor is to be adhered to as to render exposed portions of said compound sticky;
    a third step of applying the first color phosphor on the surface of said compound layer;
    a fourth step of removing surplus first color phosphor applied on unexposed portions of said compound layer;
    a fifth step of conducting said second, third and fourth steps consecutively for the phosphor of second and third colors to form a fluorescent screen comprising picture elements of triads of three color phosphors on the inner face of the panel; and
    a sixth step of filming or aluminizing said fluorescent screen;
    the improvement wherein after applying the three color phosphors to the inner face of the panel and before said filming or aluminizing step, said said inner panel face with picture elements of three color phosphors is treated with an aqueous solution of polymer coagulant to improve the adhesiveness of the phosphor to the inner panel face thereby allowing sufficient washing to form a color picture tube having better quality and improved brightness.

2. A method according to claim 1 wherein the concentration of the polymer coagulant in said aqueous solution is 0.01 to weight %.

3. A method according to claim 1 which further includes washing the panel inner face after said treating step.

4. A method according to claim 1 or 3 wherein the panel inner face is rotated at 15 to 180 rpm in the treatment of the treating step.

5. A method according to claim 3 wherein the washing agent is water.

6. A method according to claim 3 wherein the washing agent is the solution used in the treating step.

7. A method according to claim 3 wherein the washing agent is polymer coagulant having a concentration lower than that of the solution used in the treating step.

8. A method of forming a fluorescent screen for a color picture tube comprising:
    a first step of coating an inner panel face of the color picture tube with a photosticky substance mainly containing a diazonium compound to form a layer of the compound;
    a second step of exposing to light through a color selection electrode portions of said compound layer where a first color phosphor is to be adhered so as to render exposed portions of said compound sticky;
    a third step of applying the first color phosphor on the surface of said compound layer;
    a fourth step of removing surplus first color phosphor applied on unexposed portions of said compound layer;
    a fifth step of conducting said second, third, fourth steps consecutively for the phosphor of second and third colors to form a fluorescent screen comprising picture elements of triads of three color phosphors on the inner face of the panel; and a sixth step of filming or aluminizing said fluorescent screen;

the improvement wherein after applying the three color phosphors to the inner face of the panel and before said filming or aluminizing step, said inner panel face with picture elements of triads of three color phosphors is treated with an aqueous solution containing polymer coagulant and surfactant, thereby improving the quality and brightness of the fluorescent screen after filming.

9. A method according to claim 8 wherein the concentration in said aqueous solution of the polymer coagulant is 0.01 to 1 weight % and that of the surfactant is 0.05 to 10 weight %, the relation therebetween being complementary.

10. A method according to claim 8 or 11 wherein the panel inner face is rotated at 15 to 180 rpm in the treatment of the treating step.

11. A method according to claim 8 which include washing the panel inner face after said treating step.

12. A method according to claim 11 wherein the washing agent is water.

13. A method according to claim 11 wherein the washing agent is the solution used in the treating step.

14. A method according to claim 11 wherein the washing agent is an aqueous solution containing polymer coagulant having a concentration lower than that of the solution used in the treating step and surfactant.

15. A method according to claim 1, 8, 3 or 11 or wherein the panel inner face is dipped in the solution in the treating step.

16. A method according to claim 1, 8, 3 or 11 wherein the polymer coagulant comprises polyacrylamide, partially hydrolyzed salt of polyacrylamide, polyacrylic acid sodium salt, gelatin, polyalginic acid soda or carboxymethylcellulose, or a mixture of some of these substances.

17. A method according to claim 8 or 11 wherein the surfactant comprises polyoxyethylenealkyl ether, polyoxyethylenealkylphenol ether, alkylbetaine, or polyoxyethylene sulfate salt, or a mixture of some of these substances.

18. A method according to claim 9 or 11 wherein the treatment solution further contains 0.01 to 0.5 weight % of colloidal silica in said solution.

19. A method acording to claim 1 or 8 wherein said aqueous solution has a pH of 4.5 to 9.

20. A method according to claim 19 wherein the pH is 5.5 to 8.

* * * * *